(12) United States Patent
Mizumura

(10) Patent No.: US 10,301,716 B2
(45) Date of Patent: *May 28, 2019

(54) DEPOSITION MASK AND METHOD FOR PRODUCING DEPOSITION MASK

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/002,985

(22) Filed: Jun. 7, 2018

(65) Prior Publication Data

US 2018/0282856 A1 Oct. 4, 2018

Related U.S. Application Data

(60) Division of application No. 14/980,683, filed on Dec. 28, 2015, now Pat. No. 10,053,767, which is a
(Continued)

(30) Foreign Application Priority Data

Jul. 2, 2013 (JP) ................................. 2013-138814

(51) Int. Cl.
*C23C 14/04* (2006.01)
*B23K 26/382* (2014.01)
(Continued)

(52) U.S. Cl.
CPC ............ *C23C 14/042* (2013.01); *B23K 11/11* (2013.01); *B23K 26/382* (2015.10); *C23C 16/042* (2013.01); *H01L 51/0011* (2013.01)

(58) Field of Classification Search
None
See application file for complete search history.

(56) References Cited

U.S. PATENT DOCUMENTS

2004/0202821 A1  10/2004  Kim et al.
2011/0067630 A1   3/2011  Ko et al.
2014/0000792 A1   1/2014  Ko et al.

FOREIGN PATENT DOCUMENTS

CN   1800970 A    7/2006
CN   102023474    4/2011
(Continued)

OTHER PUBLICATIONS

Chinese Office Action from Chinese Patent Application No. 201480037834.8, dated Jun. 2, 2017, 12 pages.
(Continued)

*Primary Examiner* — Charles Capozzi
(74) *Attorney, Agent, or Firm* — Morgan, Lewis & Bockius LLP

(57) ABSTRACT

A deposition mask is provided. The deposition mask including: a resin film 1 in which penetrating opening patterns 4 are formed and a frame-shaped metal thin film 5 having an opening is provided on one face 1a of the film 1; a metal mask 2 provided at a position corresponding to the opening of the metal thin film 5 on one face 1a side of the film 1, the metal mask 2 being separated from and independent of the film 1, the metal mask 2 being provided with through holes 6; and a metal frame 3 positioned on one face 1a side of the film 1, the metal frame 3 supporting the film 1 and the metal mask 2 by spot-welding a portion of the metal thin film 5 and an edge region of the metal mask 2 to one end face 3a.

6 Claims, 10 Drawing Sheets

Related U.S. Application Data continuation of application No. PCT/JP2014/067332, filed on Jun. 30, 2014.

(51) Int. Cl.
*B23K 11/11* (2006.01)
*C23C 16/04* (2006.01)
*H01L 51/00* (2006.01)

(56) References Cited

FOREIGN PATENT DOCUMENTS

| | | |
|---|---|---|
| CN | 102482759 | 5/2012 |
| CN | 1423511 | 6/2013 |
| JP | H 07-300664 | 1/1995 |
| JP | 2001-237072 A | 8/2001 |
| JP | 2006-188748 A | 7/2006 |
| JP | 2013-083704 A | 5/2013 |
| JP | 2013-095992 A | 5/2013 |
| JP | 2013-095993 | 5/2013 |

OTHER PUBLICATIONS

International Preliminary Report on Patenability from International Application No. PCT/JP2014/067332, dated Jan. 14, 2016, 10 pages.
Taiwanese Office Action from Taiwanese Patent Application No. 103122481, dated Jul. 14, 2017, 5 pages.

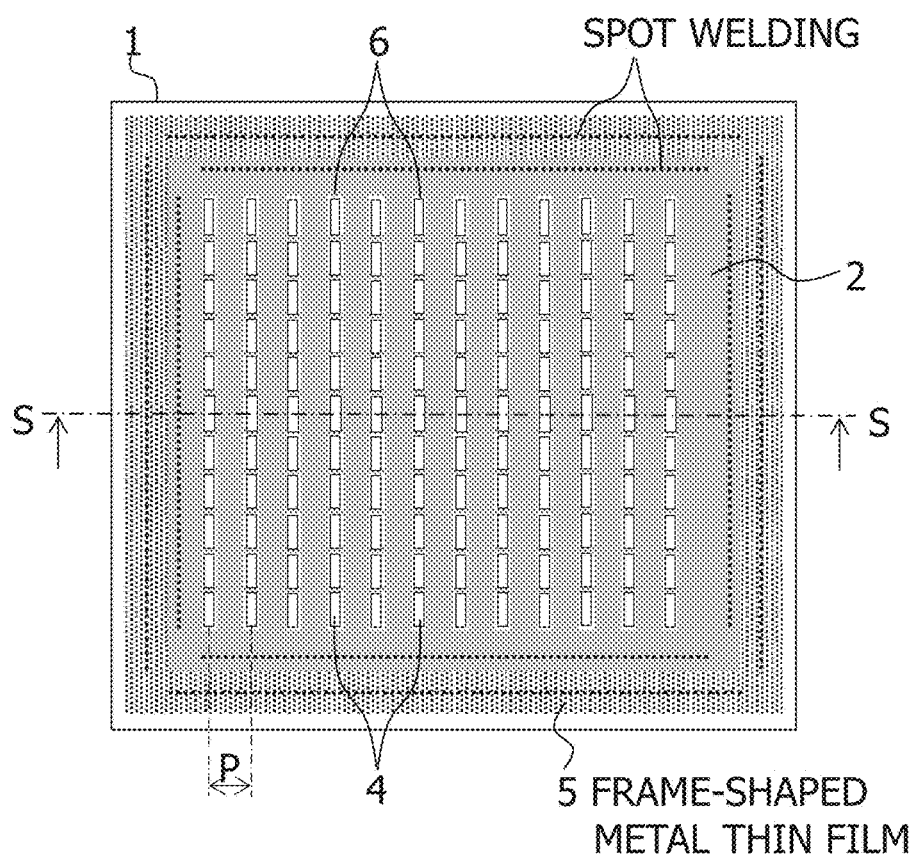
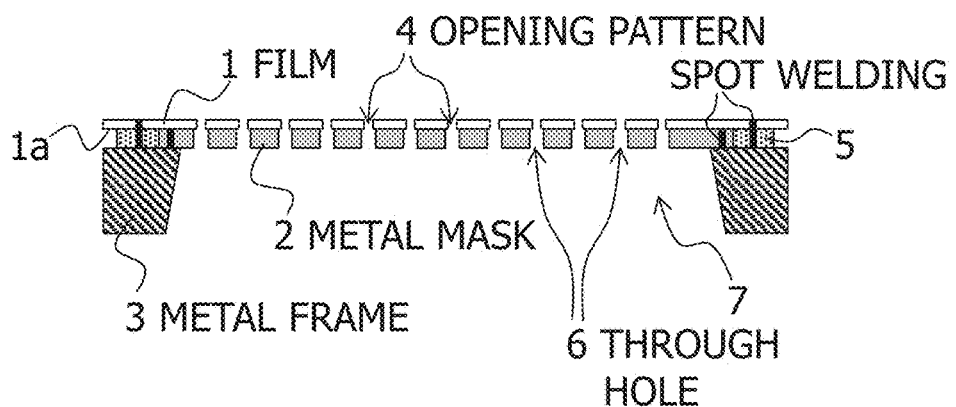

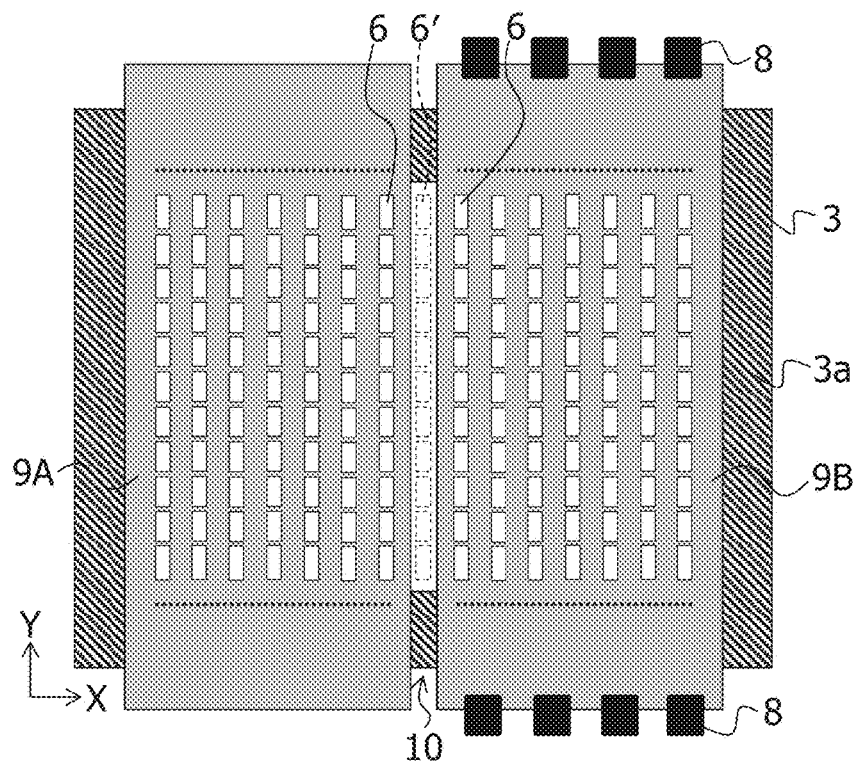
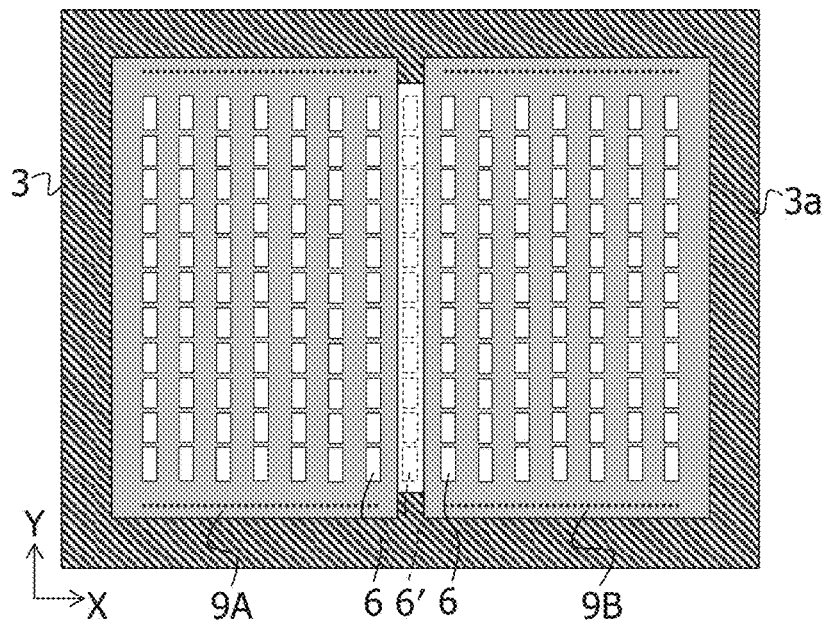

DEPOSITION MASK AND METHOD FOR PRODUCING DEPOSITION MASK

CROSS-REFERENCE TO RELATED APPLICATIONS

This application is a divisional application of Ser. No. 14/980,683, filed Dec. 28, 2015, now issued as U.S. Pat. No. 10,053,767, which is a continuation application of PCT/JP2014/067332, filed on Jun. 30, 2014, both of which are hereby incorporated by reference in their entirety for all purposes.

BACKGROUND OF THE INVENTION

1. Field of the Invention

The present invention relates to a deposition mask provided with a plurality of opening patterns corresponding to a plurality of thin film patterns to be deposited on a substrate, and more particularly, relates to a deposition mask capable of forming high definition thin film patterns with high positional accuracy, and a method of manufacturing the deposition mask.

2. Description of Related Art

A conventional deposition mask is a metal mask provided with a plurality of penetrating opening patterns corresponding to a plurality of thin film patterns to be deposited on a substrate. The mask is manufactured as follows: a first resist pattern having a plurality of through openings is formed on a metal plate, an etching process is performed through the through openings of the first resist pattern to thereby form a plurality of through holes penetrating through the metal plate, the first resist pattern is removed, a second resist pattern having a plurality of second through openings, each exposing a metal edge portion with a predetermined width around each of the plurality of opening patterns on the metal plate, is formed, an etching process is performed through the second through openings of the second resist pattern, to thereby form: a mask body portion around each of the plurality of through openings; and a peripheral portion, having a thickness greater than that of the mask body portion and positioned around the mask body portion, and then, the second resist pattern is removed (for example, see Japanese Patent Application Laid-open Publication No. 2001-237072).

However, in such a conventional deposition mask, the etching process is performed on the metal plate to form the plurality of penetrating opening patterns in the metal plate, and thus, it is not possible to form a high definition opening pattern with a high level of accuracy. In particular, for example, in a case of a large area deposition mask for an organic EL display panel having a large area in which a length of one side of equal to or greater than several tens of cm, it is not possible to uniformly form a high definition opening pattern over the entire surface of the mask, due to the occurrence of etching unevenness, an increase in an opening area caused by isotropic etching, and the like.

SUMMARY OF THE INVENTION

Thus, the applicant has proposed a composite mask having a structure in which a resin film and a magnetic metal member having a thin plate shape are brought into tight contact with each other. In the resin film, corresponding to the thin film patterns, a plurality of opening patterns each having the same shape and dimensions as those of each of a plurality of thin film patterns to be deposited on a substrate are formed. In the magnetic metal member, through holes, each having a size capable of arranging therein at least one of the plurality of opening patterns, are formed.

The composite mask is obtained by forming opening patterns on a thin resin film having a thickness of approximately 10 μm to 30 μm by laser beam machining, and has advantages that it is possible to form high definition opening patterns with a high level of accuracy and to uniformly form opening patterns over the entire surface of the above-mentioned large area deposition mask.

However, in the composite mask, a magnetic metal member such as Invar or an Invar alloy, which has a smaller thermal expansion coefficient, and a member such as a resin film, which has a relatively large thermal expansion coefficient, are brought into tight contact with each other at room temperature or higher, and thus internal stress is generated in the resin film due to a difference in thermal expansion between both the members. Accordingly, when a plurality of opening patterns are sequentially formed in the resin film by laser beam machining, the internal stress is partially released. As a result, it can be understood that the positions of the opening patterns cumulatively deviate. Therefore, there is a concern that high definition thin film patterns cannot be formed with high positional accuracy.

Therefore, the present invention is contrived in view of such problems, and an object thereof is to provide a deposition mask capable of forming high definition thin film patterns with high positional accuracy, and a method of manufacturing the deposition mask.

In order to accomplish the object, a deposition mask according to a first aspect of the invention is a deposition mask provided with a plurality of opening patterns corresponding to a plurality of thin film patterns to be deposited on a substrate. The deposition mask includes: a resin film in which the plurality of penetrating opening patterns are formed and a frame-shaped metal thin film having an opening having a size capable of arranging therein the plurality of opening patterns is provided on one face of the resin film; a metal mask provided at a position corresponding to the opening of the metal thin film on one face side of the resin film, the metal mask being separated from and independent of the resin film, the metal mask being provided with a plurality of through holes, each having a size capable of arranging therein at least one of the plurality of opening patterns; and a metal frame positioned on the one face side of the resin film, the metal frame being formed to have a frame shape provided with an opening portion having a size capable of arranging therein the plurality of through holes of the metal mask, the metal frame being configured to support the resin film and the metal mask by spot-welding a portion of the metal thin film and an edge region of the metal mask to one end face in a state in which the resin film and the metal mask are provided under tension on the metal frame.

In addition, a method of manufacturing a deposition mask according to a second aspect of the invention is a method of manufacturing a deposition mask provided with a plurality of opening patterns corresponding to a plurality of thin film patterns to be deposited on a substrate. The method includes: a first step of depositing a frame-shaped metal thin film having an opening having a size capable of arranging therein the plurality of opening patterns, on one face of a resin film; a second step of forming a metal mask by providing a plurality of through holes, each having a size capable of arranging therein at least one of the plurality of opening patterns, in a metal sheet having an external dimension having a size capable of being placed within the opening of the metal thin film; a third step of spot-welding a peripheral region of the metal mask to one end face of the metal frame in a state in which the metal mask is provided under tension across a frame-shaped metal frame having an opening portion having a size capable of arranging therein the plurality of through holes; a fourth step of spot-welding a portion of the metal thin film of the resin film to one end face of the metal frame in a state in which the resin film covers the metal mask with a metal thin film side of the resin film facing the metal mask and the resin film is provided under tension across the metal frame; and a fifth step of irradiating a portion of the resin film through the through hole of the metal mask with a laser beam, to thereby form the opening pattern.

According to the present invention, the resin film and the metal mask are separated from and independent of each other rather than being brought into tight contact with and fixed to each other unlike the above-mentioned composite mask, and thus the resin film does not have internal stress based on a difference in thermal expansion between the resin film and the metal mask. Accordingly, even when a plurality of opening patterns is formed by laser beam machining, positional deviation of the opening patterns can be reduced, and thus, the opening patterns can be formed with high positional accuracy. Therefore, it is possible to form high definition thin film patterns with high positional accuracy.

BRIEF DESCRIPTION OF THE DRAWINGS

FIGS. 1A and 1B are diagrams illustrating a deposition mask according to a first embodiment of the present invention; FIG. 1A is a plan view, and FIG. 1B is a diagram taken along with a line S-S of FIG. 1A when seen from an arrow.

FIG. 5A is a plan view, and FIG. 5B is a diagram taken along with a line T-T of FIG. 5A when seen from an arrow.

FIGS. 7A and 7B are diagrams for explaining the method of manufacturing the deposition mask according to the second embodiment, and are plan views illustrating a second half section of the process of joining the metal mask to the metal frame.

DESCRIPTION OF PREFERRED EMBODIMENTS

Figure 2A:
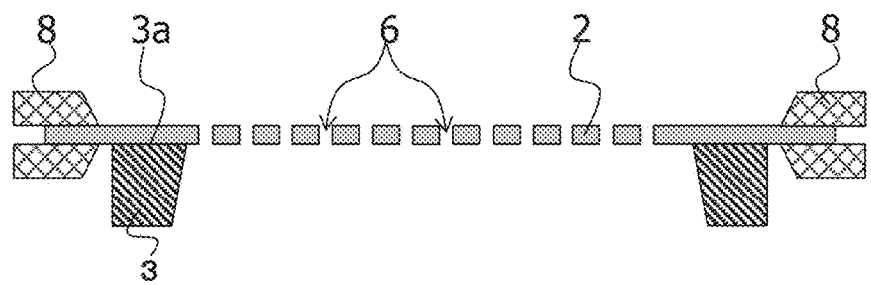
FIGS. 2A to 2C are diagrams for explaining a method of manufacturing the deposition mask according to the first embodiment, and are cross-sectional views illustrating a process of joining a metal mask to a metal frame.

Hereinafter, embodiments of the present invention will be described in detail with reference to the accompanying drawings. FIGS. 1A and 1B are diagrams illustrating a deposition mask according to a first embodiment of the present invention. FIG. 1A is a plan view, and FIG. 1B is a diagram taken along with a line S-S of FIG. 1A when seen from an arrow. The deposition mask is provided with a plurality of opening patterns corresponding to a plurality of thin film patterns to be deposited on a substrate, and is configured to include a resin film 1, a metal mask 2, and a metal frame 3.

The film 1 is a resin film provided with a plurality of penetrating opening patterns 4 formed therein so as to correspond to the plurality of thin film patterns to be deposited on the substrate, each opening pattern 4 having the same shape and dimensions as those of the corresponding thin film pattern, and the film 1 is, for example, a resin film made of a resin that transmits visible light, such as polyimide or polyethylene-terephthalate (PET), and having a thickness of approximately 10 µm to 30 µm.

Furthermore, a metal thin film (hereinafter, referred to as a "frame-shaped metal thin film") 5 is deposited on one face 1a of the film 1 by plating or the like with a thickness of approximately 30 µm to 50 µm. The frame-shaped metal thin film 5 has an opening having a size capable of arranging therein the plurality of opening patterns 4, and thus, has a frame shape with an appropriate width, and the frame-shaped metal thin film 5 is made of, for example, Invar or an Invar alloy.

The metal mask 2 is provided at a position corresponding to the inside of the frame (inside of the opening) of the frame-shaped metal thin film 5 on one face 1a side of the film 1, in a manner such that the metal mask 2 is separated from and independent of the film 1. The metal mask 2 supports the film 1 at the time of forming the plurality of opening patterns 4 by laser beam machining, and is attracted by a magnet provided on a back face of the substrate during deposition to bring the film 1 into tight contact with a face of the substrate. The metal mask 2 is constituted by a metal sheet, which has an external dimension of a size capable of being placed within the frame of the frame-shaped metal thin film 5, the metal sheet being formed of a magnetic metal material such as Invar or an Invar alloy, the metal sheet having a thickness of approximately 30 µm to 50 µm, which is substantially the same as that of the frame-shaped metal thin film 5. In addition, the metal mask 2 is provided with a plurality of through holes 6 having a size capable of arranging therein at least one of the plurality of opening patterns 4.

The metal mask 2 may be provided with a plurality of through holes having an elongated slit shape and arranged in parallel, or, for example, as illustrated in FIG. 1A, the metal mask 2 may be provided with rows of a plurality of through holes, arranged in parallel at a predetermined constant arrangement pitch P, each row having a plurality of through holes 6, each having a size capable of arranging therein one opening pattern 4.

The frame-shaped metal frame 3 is positioned on one face 1a side of the film 1, and the metal frame 3 has an opening portion 7 having a size capable of arranging therein the plurality of through holes 6 of the metal mask 2, and has an external shape having a size that is substantially the same as that of the external shape of the frame-shaped metal thin film 5 of the film 1. The metal frame 3 is configured to support the film 1 and the metal mask 2 by spot-welding a portion of the frame-shaped metal thin film 5 of the film 1 and an edge region of the metal mask 2 to one end face 3a (see FIGS. 2A to 2C and 3A to 3d) in a state in which the film 1 and the metal mask 2 are provided under tension on the metal frame 3, and the metal frame 3 is formed of a magnetic metal material such as Invar or an Invar alloy, having a thickness of approximately 30 mm to 50 mm.

Next, a method of manufacturing the deposition mask configured in this manner will be described.

First, the film 1 in which the frame-shaped metal thin film 5 having an opening having a size capable of arranging therein the plurality of opening patterns 4 is formed on one face 1a thereof, is prepared. In more detail, the film 1 is a resin film made of a resin that transmits visible light, such as polyimide, having a thickness of 10 μm to 30 μm, cut out into a square shape, and the film 1 is provided with the frame-shaped metal thin film 5 having an appropriate width formed on one face 1a along the peripheral portion thereof. At this time, the size of the opening of the frame-shaped metal thin film 5 is set to be capable of arranging therein the plurality of opening patterns 4 to be formed in the film 1 later and capable of accommodating the metal mask 2 in the opening.

Here, the formation of the frame-shaped metal thin film 5 will be described in detail.

First, a seed layer constituted by a metal film having good conductivity is formed on one face 1a of the resin film 1, so as to have a thickness of approximately 50 nm by a known deposition technique such as vapor deposition, sputtering, or electroless plating. In this case, when the film 1 is polyimide, it is preferable to use nickel or the like as the seed layer. Since copper diffuses into polyimide, copper is not preferable as a seed layer for polyimide. On the other hand, when the film 1 is PET, it is preferable to use copper or the like as a seed layer in terms of adhesiveness.

Subsequently, a photoresist is applied onto the seed layer, so as to have a thickness of, for example, 30 μm, and is exposed and developed using a photomask, thereby forming an island pattern in a portion corresponding to the inside of the frame (inside of the opening) of the frame-shaped metal thin film 5 and a portion corresponding to the outside of the frame.

Then, a metal thin film formed of a magnetic metal material such as Invar or an Invar alloy is deposited on the seed layer at a portion not covered by the island pattern by a known plating technique, so as to have a thickness of, for example, 30 μm. Thereafter, the island pattern is removed, and the seed layer positioned below the island pattern is removed by etching. Thereby, the frame-shaped metal thin film 5 is formed on one face 1a of the film 1.

In addition, the metal mask 2 provided with the plurality of through holes 6 is prepared. The metal mask 2 is obtained by forming, in a metal sheet, the plurality of through holes 6, each having a size capable of arranging therein at least one of the plurality of opening patterns 4 to be formed in the film 1. The metal sheet has an external dimension having a size capable of being placed within the frame of the frame-shaped metal thin film 5, and is formed of a magnetic metal material such as Invar or an Invar alloy, and has a thickness of, for example, approximately 30 μm.

The plurality of through holes 6 is formed in the following manner. That is, a photoresist is applied onto one face of the metal sheet so as to have an appropriate thickness and is exposed and developed using a photomask, thereby forming a resist mask having openings at positions corresponding to the plurality of through holes 6. Subsequently, the metal sheet is etched using the resist mask, and the through holes 6 are formed in the portions of the metal sheet which correspond to the openings. Thereby, the metal mask 2 is formed.

Furthermore, the metal frame 3 having a frame shape is prepared. The metal frame 3 is configured to have the external dimension thereof substantially coinciding with the external dimension of the frame-shaped metal thin film 5 of the film 1, and to have the opening portion 7 within the frame set to have a size capable of arranging therein the plurality of through holes 6. The opening portion 7 is formed by, for example, cutting a magnetic metal plate such as Invar or an Invar alloy, having a thickness of 30 mm to 50 mm.

Hereinafter, a method of manufacturing the deposition mask according to the first embodiment of the present invention will be described with reference to FIGS. 2A to 2C, 3A to 3D, and 4.

Figure 2B:
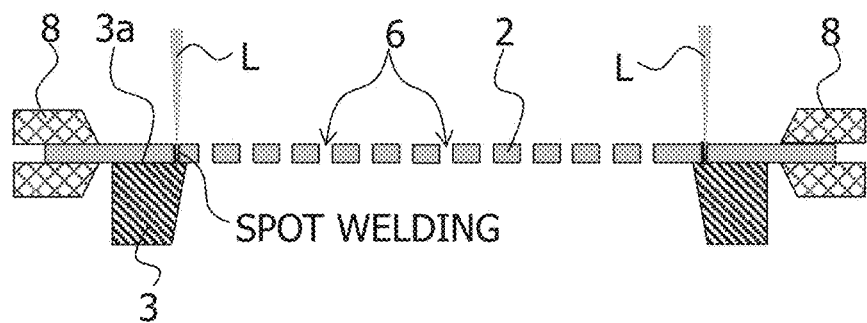
Figure 2C:
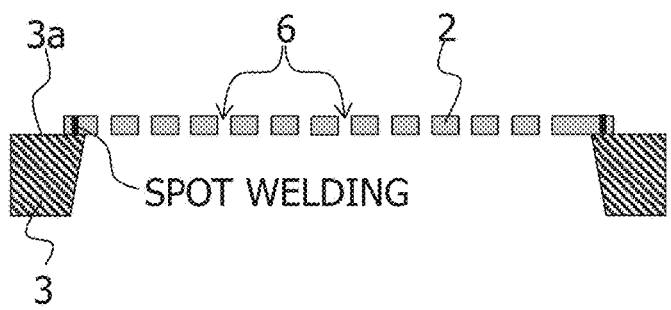

First, as illustrated in FIG. 2A, the metal mask 2 is provided under tension across one end face 3a of the metal frame 3 in a state in which a peripheral portion of the metal mask 2 is held by tension grips 8 and is laterally pulled in a direction parallel to the face of the metal mask 2 to have an appropriate tension applied thereto. In this state, as illustrated in FIG. 2B, a peripheral region of the metal mask 2 is irradiated with a laser beam L using, for example, a YAG laser, and the metal mask 2 is spot-welded onto one end face 3a of the metal frame 3. The spot welding may be performed at a plurality of locations. Thereafter, as illustrated in FIG. 2C, the peripheral portion of the metal mask 2 is cut off by a cutter so that the metal mask 2 can be placed within the inside of the frame of the frame-shaped metal thin film 5 formed on the film 1.

Figure 3A:
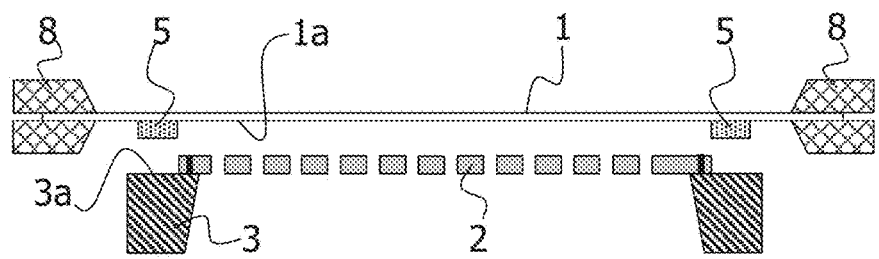
FIGS. 3A to 3D are diagrams for explaining the method of manufacturing the deposition mask according to the first embodiment, and are cross-sectional views illustrating a process of joining a resin film to the metal frame.
Figure 3B:
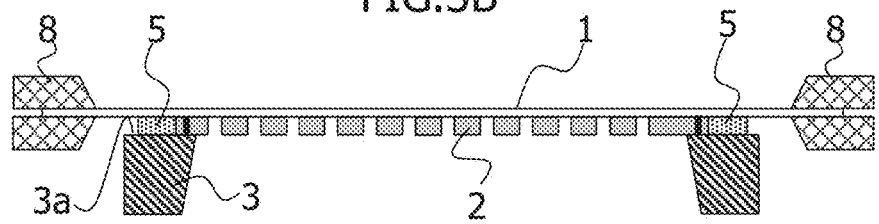
Figure 3C:
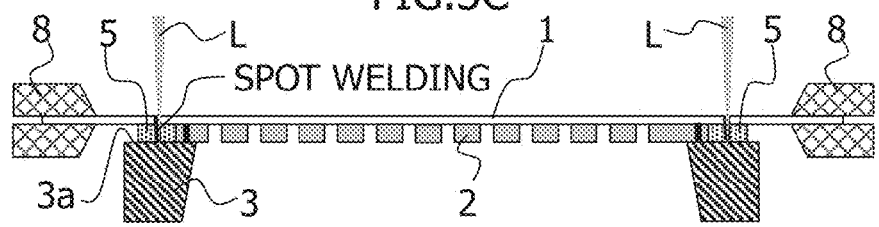
Figure 3D:
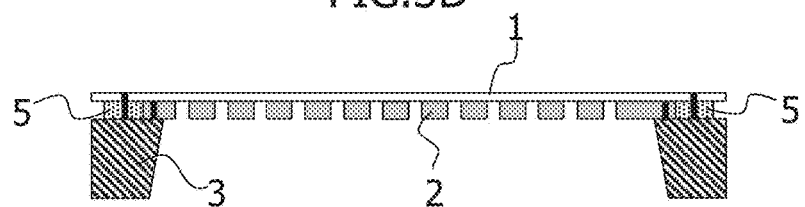

Next, as illustrated in FIG. 3A, the peripheral portion is held by the plurality of tension grips 8 and is laterally pulled in a direction parallel to the face of the film 1 in a state in which one face 1a of the film 1 having the frame-shaped metal thin film 5 provided thereon faces the metal mask 2, and an appropriate tension is applied to the film 1 to such an extent that the film 1 is not stretched. In this state, the film 1 is positioned above the metal frame 3 so as to cover the metal mask 2. Next, as illustrated in FIG. 3B, after the metal mask 2 supported by the metal frame 3 is adjusted to be positioned within the frame of the frame-shaped metal thin film 5 of the film 1, the frame-shaped metal thin film 5 of the film 1 is brought into tight contact with one end face 3a of the metal frame 3. Subsequently, as illustrated in FIG. 3C, the portion of the frame-shaped metal thin film 5 is irradiated with a laser beam, and thus the frame-shaped metal thin film 5 is spot-welded to one end face 3a of the metal frame 3. The spot welding may be performed at a plurality of locations similar to the spot welding of the metal mask 2. Meanwhile, the film 1 remains having the appropriate tension applied thereto until the spot welding is terminated. Thereafter, as illustrated in FIG. 3D, the film 1 is cut along the outer peripheral of the metal frame 3. Thereby, the film 1 is fixed to the metal frame 3 and thus supported thereby. In this case, the film 1 and the metal mask 2 are separated from and independent of each other.

Figure 4:
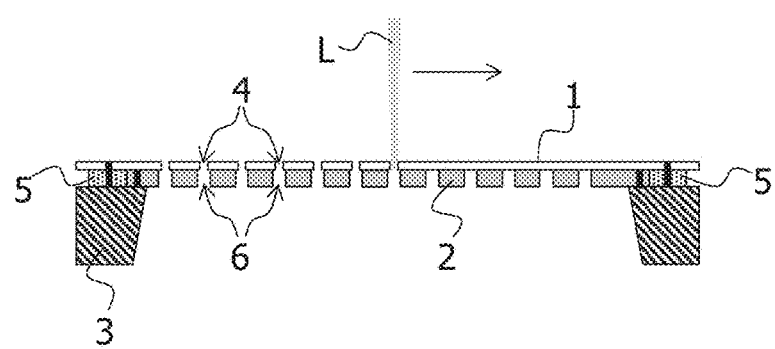
FIG. 4 is a diagram for explaining the method of manufacturing the deposition mask according to the first embodiment, and is a cross-sectional view illustrating a process of forming opening patterns.

Subsequently, the metal frame 3 is mounted on an X-Y stage of a laser beam machining device with the film 1 located above the metal frame 3. Then, as illustrated in FIG. 4, the portions of the film 1 corresponding to the through holes 6 of the metal mask 2 are irradiated with a laser beam L having a wavelength of equal to or less than 400 nm, for example, so that an irradiation area is shaped to be equal to the area of the opening pattern 4, and the film 1 is ablated to be removed. Thereby, for example, one opening pattern 4 penetrating the film 1 is formed, corresponding to one through hole 6. Thereafter, the portions of the film 1 corresponding to the through holes 6 of the metal mask 2 are irradiated with a laser beam L while moving the X-Y stage stepwise in the X and Y directions at a predetermined pitch which is determined in advance, thereby forming the opening patterns 4. Therefore, the deposition mask illustrated in FIG. 1 is completed.

According to the deposition mask of the present invention, the film 1 and the metal mask 2 are separated from and independent of each other rather than being brought into tight contact with and fixed to each other unlike the above-mentioned composite mask, and thus the film 1 does not have internal stress based on a difference in thermal expansion between the film 1 and the metal mask 2.

Accordingly, even when the plurality of opening patterns 4 is formed by laser beam machining, positional deviation of the opening patterns 4 can be reduced, and thus, it is possible to form the opening patterns 4 with high positional accuracy.

In addition, when the opening patterns 4 are formed in the film 1, the film 1 is not bent, since the film 1 is supported by the metal mask 2. Accordingly, it is possible to form the opening patterns 4 with high positional accuracy by the effect of supporting achieved by the metal mask 2.

However, since the film 1 has an appropriate tension applied thereto to such an extent that the film 1 is not stretched, the film 1 may have slight internal stress caused by the tension. Accordingly, there is a concern that slight positional deviation of the opening patterns 4 may occur when forming the opening patterns 4. However, since the tension is equally, laterally applied parallel to the face of the film 1, the internal stress of the film 1 is uniformly distributed into the face of the film 1, and thus the direction and amount of positional deviation of the opening pattern 4 can be easily predicted by being confirmed in advance by an experiment or the like. Accordingly, when the opening patterns 4 are formed by laser beam machining while adjusting the position of irradiation with a laser beam L by estimating the positional deviation, all of the opening patterns 4 finally formed can be positioned at correct positions.

Figure 5A:
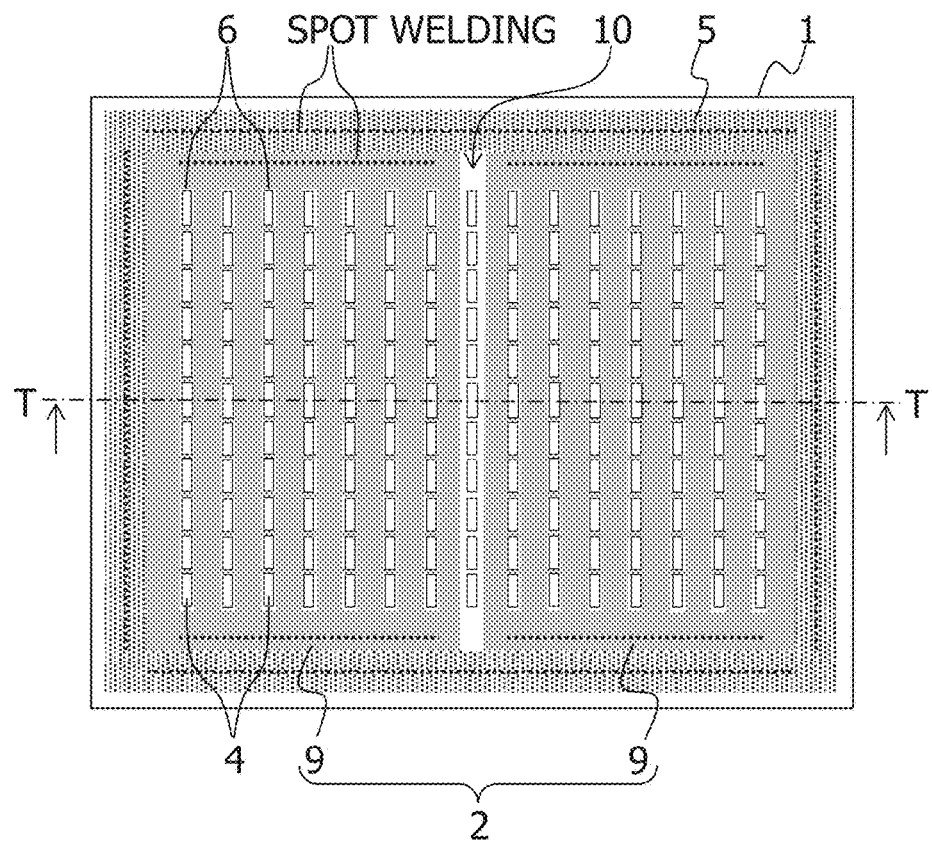
FIGS. 5A and 5B are diagrams illustrating a deposition mask according to a second embodiment of the present invention.
Figure 5B:
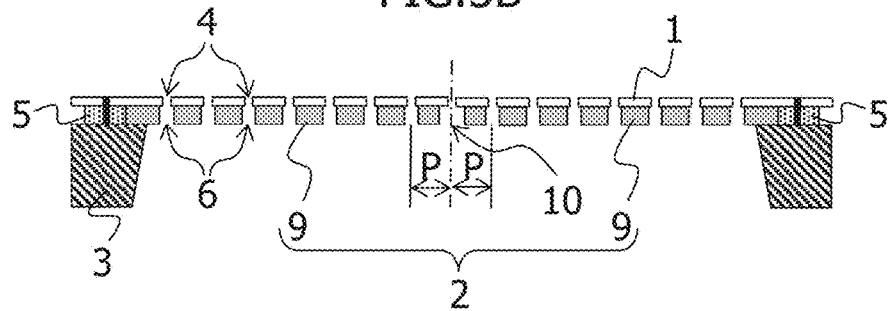

FIG. 5 is a diagram illustrating a deposition mask according to a second embodiment of the present invention. FIG. 5A is a plan view, and FIG. 5B is a diagram taken along with a line T-T of FIG. 5A when seen from an arrow. Here, only parts different from those in the first embodiment will be described.

The second embodiment can apply to a large area substrate having a length of one side of equal to or greater than 1 m, and In the second embodiment, there are provided a film 1 with a frame-shaped metal thin film and which has the length of one side of equal to or greater than 1 m, and a metal frame 3 similarly having an external dimension having a length of one side of equal to or greater than 1 m. On the other hand, in the metal mask 2, the width of a metal sheet serving as a substrate is restricted from a problem of manufacturing equipment (in the present situation, a maximum of approximately 500 mm), and the degree of freedom in selecting a width is lower than that of the film 1 or the metal frame 3. Accordingly, in the second embodiment, the metal mask 2 is configured such that a plurality of strip-like unit masks 9 having a width of a maximum of approximately 500 mm are arranged so that the longitudinal axes of the unit masks are arranged in parallel.

In more detail, in the unit mask 9, rows of a plurality of through holes, each row having a plurality of through holes arranged in a line along the longitudinal axis thereof, or a plurality of slit-shaped through holes extending along the longitudinal axis thereof are formed at a constant arrangement pitch P in a direction perpendicular to the longitudinal axis as illustrated in FIG. 5B. In addition, the plurality of unit masks 9 are arranged parallel to each other with a gap 10 provided between the adjacent unit masks 9, so that at least one row of through holes or at least one slit-shaped through hole can be present in the gap 10 while maintaining the arrangement pitch. The unit masks 9 are spot-welded to one end face 3a of the metal frame 3. Meanwhile, FIG. 5 illustrates the plurality of through holes 6 arranged in a row, and illustrates a case in which one row of through holes 6 can be present in the gap 10.

Such a deposition mask is manufactured in the following manner.

First, the film 1 is cut out from a film sheet having a width of equal to or greater than 1 m and a thickness of 10 μm to 30 μm which is wound up in the form of a roll, and is formed to have a square shape having a length of one side of equal to or greater than 1 m. Thereafter, similarly to the first embodiment, a frame-shaped metal thin film 5 is formed on one face 1a of the film 1.

On the other hand, the unit mask 9 is cut out from a band-like metal sheet having, for example, a width of equal to or less than 500 mm and a thickness of 30 μm to 50 μm, which is wound up in the form of a roll, to obtain a metal sheet having a strip shape having a predetermined length determined in advance, and the unit mask 9 is formed by providing the plurality of through holes 6 in the metal sheet in the same manner as in the first embodiment.

Next, a process of mounting the unit masks 9 on the metal frame 3 will be performed.

Figure 6A:
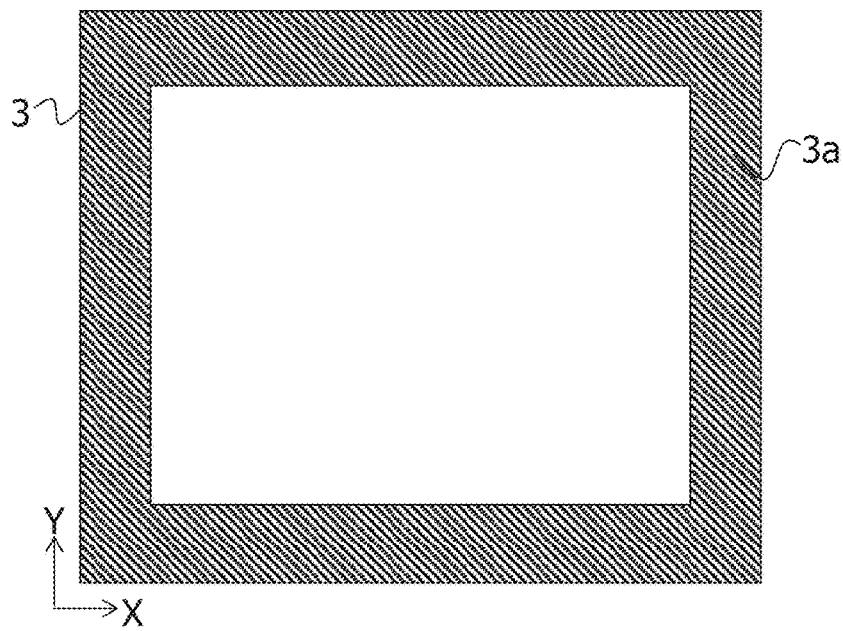
FIGS. 6A and 6B are diagrams for explaining a method of manufacturing the deposition mask according to the second embodiment, and are plan views illustrating a first half section of a process of joining a metal mask to a metal frame.

First, as illustrated in FIG. 6A, the metal frame 3 is placed on an X-Y stage at a predetermined position which is determined in advance. For example, the positions of at least two sides of the metal frame 3, which are perpendicular to each other, are regulated by positioning pins provided on the X-Y stage, and thus the metal frame is positioned.

Figure 6B:
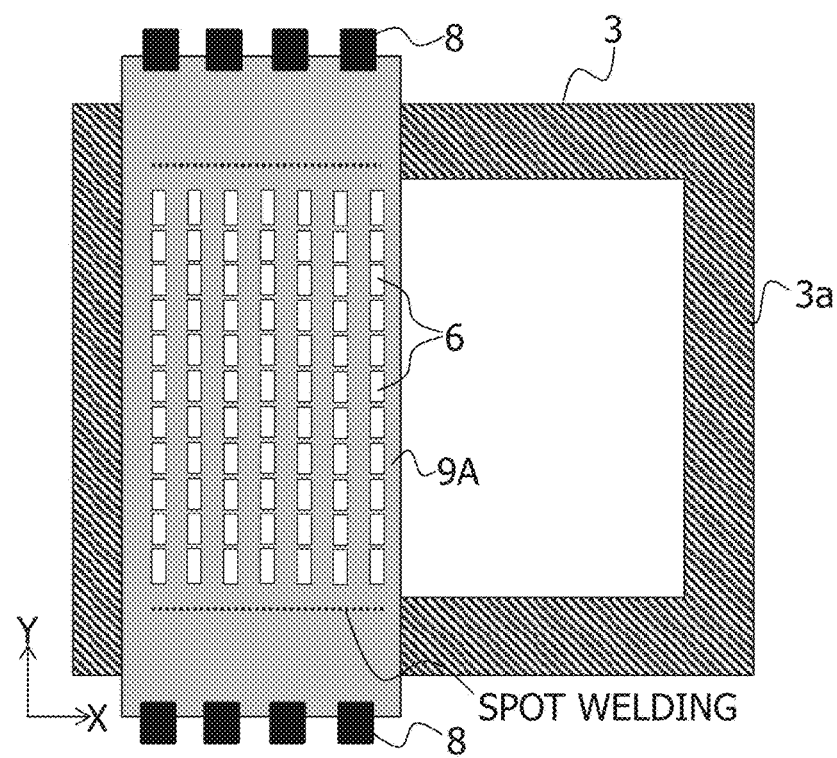

Subsequently, as illustrated in FIG. 6B, a unit mask 9A is provided under tension across one end face 3a of the metal frame 3 in a state in which edge portions thereof in the longitudinal axis direction are held by tension grips 8 and are pulled in opposite directions along the longitudinal axis to have a fixed tension applied thereto. Furthermore, in this state, an alignment mark, not shown in the drawing, which is formed in the metal frame 3 in advance and an alignment mark, not shown in the drawing, which is formed in the unit mask 9A in advance are photographed by an alignment camera. For example, the position of the unit mask 9A is adjusted so that both the marks have an appropriate positional relationship, and the unit mask 9A is aligned with respect to the metal frame 3. Thereafter, an edge region of the unit mask 9A in the longitudinal axis direction (Y direction) is irradiated with a laser beam L, and thus the unit mask 9A is spot-welded to one end face 3a of the metal frame 3 and is fixed.

Subsequently, as illustrated in FIG. 7A, a second unit mask 9B is positioned on one end face 3a of the metal frame 3 and is mounted in the same manner as the first unit mask 9A. In this case, as illustrated in FIG. 7A, the second unit mask 9B is attached so that a space between the first unit mask 9A and the second unit mask 9B serves as a gap 10 in which at least one row of through holes 6 can be present while maintaining the arrangement pitch P with respect to the adjacent row of through holes 6. Meanwhile, FIG. 7A illustrates a case in which a gap 10 in which one row of through holes (virtual through holes 6') can be present is provided.

In this manner, when the plurality of unit masks 9A and 9B are spot-welded to one end face 3a of the metal frame 3 and are fixed, both ends of the unit masks 9A and 9B in the longitudinal axis direction (Y direction) are cut off by a cutter so that the lengths of the unit masks in the longitudinal axis direction have a size capable of being placed within the frame of the frame-shaped metal thin film 5 provided on the film 1, as illustrated in FIG. 7B.

Next, a process of mounting the film 1 on the metal frame 3 will be performed.

Figure 8A:
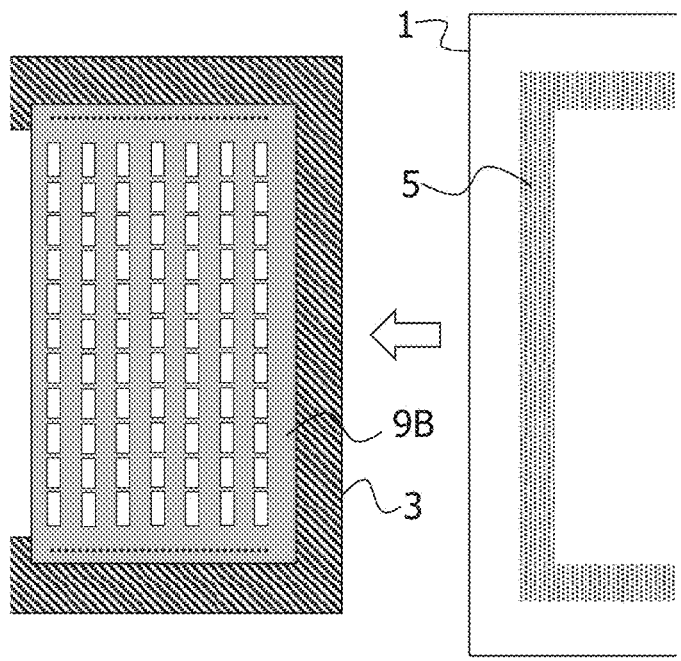
FIGS. 8A and 8B are diagrams for explaining the method of manufacturing the deposition mask according to the second embodiment, and are plan views illustrating a first half section of a process of joining a resin film to the metal frame.
Figure 8B:
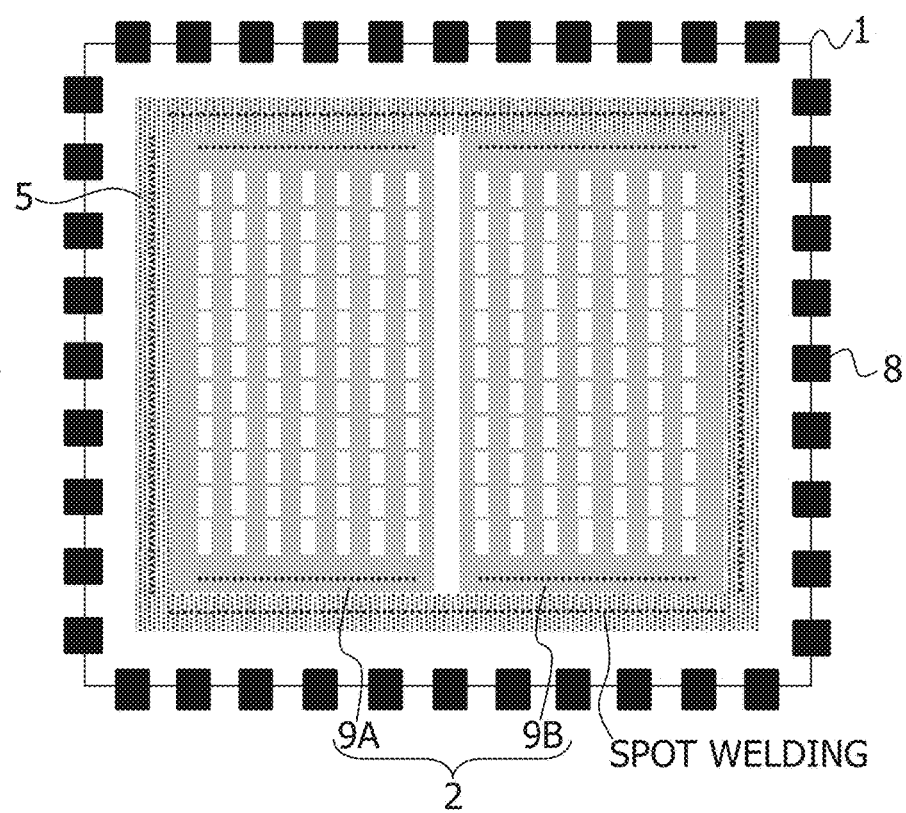

First, as illustrated in FIG. 8A, the film 1 is mounted on the metal frame 3, which has been positioned on the X-Y stage and fixed, so as to cover the metal mask 2. Furthermore, as illustrated in FIG. 8B, a peripheral portion of the film 1 is held by the tension grips 8 and is laterally pulled in a direction parallel to the face of the film 1, and the film 1 has an appropriate tension applied thereto. In this state, for example, the position of the film 1 is adjusted so that the metal mask 2 can be placed within the frame of the frame-shaped metal thin film 5 of the film 1, while observing the metal mask 2 through the film 1 from above, for example. Thereafter, the portion of the frame-shaped metal thin film 5 is irradiated with a laser beam, and thus the frame-shaped metal thin film 5 is spot-welded to one end face 3a of the metal frame 3. Thereby, the film 1 is fixed to the metal frame 3.

Figure 9:
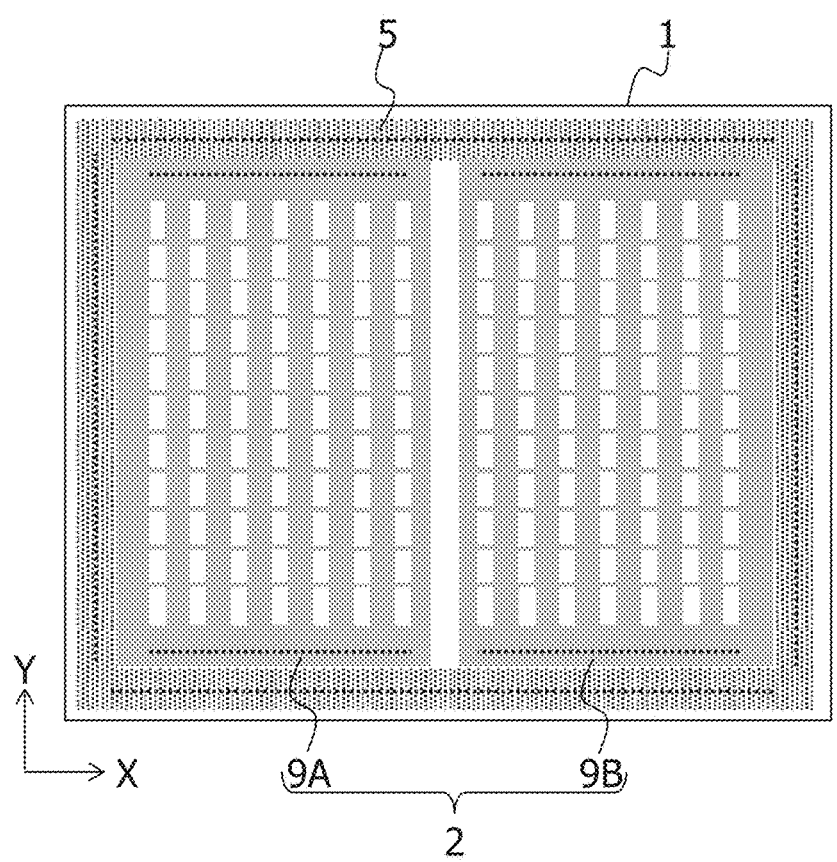
FIG. 9 is a diagram for explaining the method of manufacturing the deposition mask according to the second embodiment, and is a plan view illustrating a second half section of the process of joining the resin film to the metal frame.

Subsequently, as illustrated in FIG. 9, the film 1 is cut off along the outer periphery of the metal frame 3, and thus the external shape of the deposition mask is trimmed.

Figure 10:
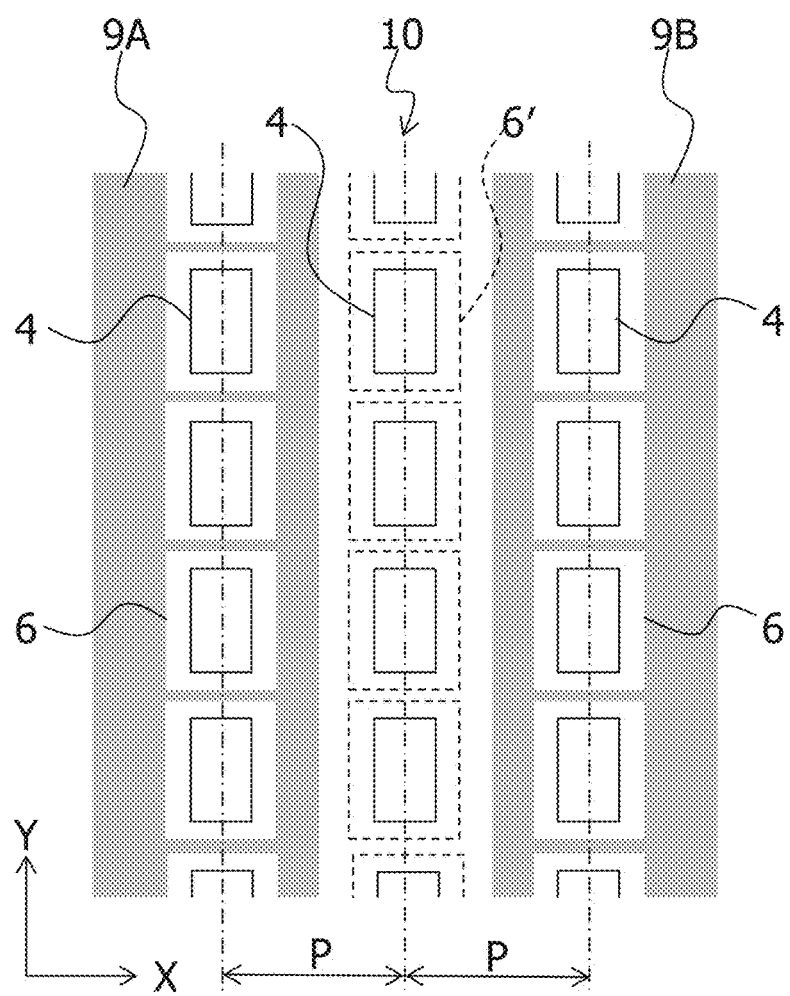
FIG. 10 is a diagram illustrating the method of manufacturing the deposition mask according to the second embodiment, and is an enlarged plan view illustrating the main part in a process of forming opening patterns.

Thereafter, similarly to the first embodiment, the portions of the film 1 which correspond to the plurality of through holes 6 of the metal mask 2 are irradiated with a laser beam L while moving the X-Y stage stepwise in the X and Y directions, thereby forming the plurality of opening patterns 4. In this case, as illustrated in an enlarged manner in FIG. 10, correspond to the virtual through holes 6', the opening patterns 4 are also formed in the portion of the gap 10 between the unit masks 9A and 9B adjacent to each other, and thus, for example, rows, each including the opening patterns 4 arranged in a line in the Y direction, are formed in the film 1 so as to be lined up at an arrangement pitch P in the X direction.

In this manner, according to the deposition mask of the second embodiment of the present invention, it is possible to obtain the same effects as those in the first embodiment and to easily manufacture a large area deposition mask having a length of one side of equal to or greater than 1 m.

The deposition mask according to the present invention is not limited to a mask for vapor deposition, for example, for an organic EL layer of an organic EL display panel, and can be applied as a mask for sputtering film formation, for example, for a transparent electrode of an electrostatic capacitive touch panel.

It should be noted that the entire contents of Japanese Patent Application No. 2013-138814, filed on Jul. 2, 2013, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A deposition mask provided with a plurality of opening patterns corresponding to a plurality of thin film patterns to be deposited on a substrate, the deposition mask comprising:
    a resin film in which the plurality of opening patterns are formed and a frame-shaped metal thin film having an opening having a size capable of arranging thereon the plurality of opening patterns provided on one face of the resin film;
    a metal mask provided at a position corresponding to the opening of the metal thin film on the one face side of the resin film, the metal mask being separable from and independent of the resin film, the metal mask comprising a plurality of strip-shaped unit masks arranged so that longitudinal axes of the unit masks are arranged in parallel and provided with a plurality of through holes, each through hole having a size capable of arranging thereon at least one of the plurality of opening patterns; and
    a metal frame positioned below the resin film, the metal frame being formed to have a frame shape provided with an opening portion having a size capable of arranging thereon the plurality of through holes of the metal mask, the metal frame being configured to support the resin film and the metal mask by spot-welding a portion of the metal thin film and edge regions of the metal mask to one end face of the metal frame in a state in which the resin film and the metal mask are provided under tension on the metal frame.

2. The deposition mask according to claim 1, wherein each unit mask is configured to have rows of the plurality of through holes, each row having the plurality of through holes arranged in a line along the longitudinal axis thereof, or a plurality of slit-shaped through holes extending along the longitudinal axis thereof formed at a specific arrangement pitch in a direction perpendicular to the longitudinal axis, and
wherein the plurality of unit masks are arranged parallel to each other with a gap provided between adjacent unit masks, so that at least one row of the plurality of through holes or at least one slit-shaped through hole is able to be present in the gap while maintaining the arrangement pitch.

3. The deposition mask according to claim 2, wherein the plurality of opening patterns are also formed in a portion of the resin film which corresponds to the gap between the adjacent unit masks.

4. A method of manufacturing the deposition mask according to claim 1, the deposition mask being provided with the plurality of opening patterns corresponding to the plurality of thin film patterns to be deposited on the substrate, the method comprising:
    a first step of depositing the frame-shaped metal thin film having the opening having a size capable of arranging thereon the plurality of opening patterns on the one face of the resin film;
    a second step of forming the metal mask comprising the plurality of strip-shaped unit masks arranged so that the longitudinal axes of the unit masks are arranged in parallel and provided with the plurality of through holes, each through hole having a size capable of arranging thereon the at least one of the plurality of opening patterns, in a metal sheet which has an external dimension having a size capable of being placed within the opening of the metal thin film;

a third step of spot-welding the edge regions in a longitudinal axis direction of each unit mask of the metal mask to the one end face of the metal frame in a state in which each unit mask is provided under tension across the frame-shaped metal frame having the opening portion having a size capable of arranging thereon the plurality of through holes;

a fourth step of spot-welding the portion of the metal thin film of the resin film to the one end face of the metal frame in a state in which the resin film covers the metal mask with a metal thin film side of the resin film facing the metal mask and the resin film is provided under tension across the metal frame; and a fifth step of irradiating a portion of the resin film through the through hole of the metal mask with a laser beam, to thereby form the opening patterns.

5. The method of manufacturing the deposition mask according to claim 4, wherein each unit mask is configured to have rows of the plurality of through holes, each row having the plurality of through holes arranged in a line along the longitudinal axis thereof, or a plurality of slit-shaped through holes extending along the longitudinal axis thereof formed at a constant arrangement pitch in a direction perpendicular to the longitudinal axis, and wherein in the third step, a gap is provided between adjacent unit masks, so that at least one row of the plurality of through holes or at least one slit-shaped through hole is able to be present in the gap while maintaining the arrangement pitch, and the plurality of unit masks are spot-welded to the one end face of the metal frame.

6. The method of manufacturing the deposition mask according to claim 5, wherein in the fifth step, a portion of the resin film which corresponds to the gap between the adjacent unit masks is also irradiated with a laser beam, to thereby form the opening patterns.

* * * * *